United States Patent [19]

Cavendish et al.

[11] Patent Number: 5,119,309
[45] Date of Patent: Jun. 2, 1992

[54] FEATURE BASED METHOD OF DESIGNING AUTOMOTIVE PANELS

[75] Inventors: James C. Cavendish, Troy; Samuel P. Marin, Rochester Hills; Giles L. Ross, Brand Blanc, all of Mich.

[73] Assignee: General Motors Corporation, Detroit, Mich.

[21] Appl. No.: 675,108

[22] Filed: Mar. 25, 1991

Related U.S. Application Data

[63] Continuation of Ser. No. 343,753, Apr. 26, 1989, abandoned.

[51] Int. Cl.$^5$ .................. G05B 19/18; G06F 15/60
[52] U.S. Cl. .................. 364/474.24; 364/474.29; 395/120
[58] Field of Search .......... 364/522, 191, 192, 474.01, 364/474.05, 474.22, 474.24, 474.29

[56] References Cited

U.S. PATENT DOCUMENTS

| | | | |
|---|---|---|---|
| 3,534,396 | 10/1970 | Hart et al. | 364/474.24 |
| 4,697,240 | 9/1987 | Cedar et al. | 364/474 |
| 4,755,927 | 7/1988 | Kishi et al. | 364/191 |
| 4,792,889 | 12/1988 | Krägelin et al. | 364/191 |
| 4,821,214 | 4/1989 | Sederberg | 364/522 |
| 4,829,456 | 5/1989 | Joonishi et al. | 364/522 |

FOREIGN PATENT DOCUMENTS

0264919  4/1988  European Pat. Off.

Primary Examiner—Gary V. Harkcom
Assistant Examiner—Raymond J. Bayerl
Attorney, Agent, or Firm—A. Frank Duke

[57] ABSTRACT

A method of forming a composite surface which is comprised of a base or primary surface and a number of features, and which satisfies certain functional objectives or requirement. Implemented in a Computer Aided Design system employed to assist in the design of automobile inner panels, the method accepts as input a feature-based information which describes the geometry of a particular inner panel, and produces as an output, a composite surface with a user-specified degree of smoothness. The method permits interactive design and modification of complex inner panel surfaces, and significantly simplifies attendant aspects of the panel design process such as numerically controlled machining.

10 Claims, 7 Drawing Sheets

FIG.8

FEATURE BASED METHOD OF DESIGNING AUTOMOTIVE PANELS

This is a continuation of application Ser. No. 07/343,753, filed on Apr. 26, 1989, now abandoned.

FIELD OF THE INVENTION

This invention relates to computer aided design (CAD) and more particularly to a method of forming a composite surface which is comprised of a base or primary surface and a number of features, and which satisfies certain functional objectives or requirements. Implemented in a CAD system employed to assist in the design of automobile inner panels, the method accepts as input feature-based information which an engineer or designer naturally uses to describe the geometry of a particular inner panel, and produces as an output a composite surface with a predetermined degree of smoothness. The method of the present invention is flexible enough to permit interactive design and modification of complex inner panel surfaces, and which significantly simplify attendant aspects of the panel design process such as numerically controlled machining (NC-machining).

BACKGROUND OF THE INVENTION

A typical automobile contains some 225 stamped sheet metal panels. Of these about 15 are outer panels while the remaining 210—or about 95% of the total—are inner panels. The outer panels are characterized by their smooth, free form or sculptured shape. As such, they are well represented mathematically in computer aided design (CAD) systems by parametric, piecewise polynomial, patched surfaces (for example, Gordon surfaces, Bezier surfaces, NURB surfaces) capable of capturing their aesthetic free form geometry. Most inner panels, on the other hand, are characterized by their irregular, multi-featured shapes, often consisting of pockets, channels, ribs, etc. designed as modifications to an existing base surface, such as an offset of an outer panel, and frequently representable by analytic expressions (e.g., planes, cylinders, etc.).

The prior art computer aided inner panel design methods do not recognize these differences. Inner panels are designed and represented using the same patch-based mathematical methods as are used to design and represent outer panels. This situation has evolved because of the lack of special purpose surfacing techniques. The force fit of outer panel techniques to inner panel design has lead to a number of problems and inefficiencies.

(1) Patched surfaces are inefficient representors of inner panel surfaces. The vastly different length scales associated with a multi-featured inner panel surface can be captured in a patched surface representation only through the use of large numbers of surface patches. A large inner panel surface, using current methods, may require over 1000 surface patches to achieve the desired shape. This is in contrast to a modest 10 or so patches required for an outer panel surface of similar size. While a large number of patches is not necessarily bad in itself, current procedures force the designer to define most patches individually, thus causing much of the difficulty associated with the current practices.

(2) Inner panels designed by current methods are difficult to modify. The designer must frequently respond to engineering changes to permit, for example, the mounting of a new or updated part on the inner panel. Using current methods, this entails the complete rebuilding of not only the relevant mounting surface but also much of the surrounding surface as well. To do this the designer must repeat the tedious and difficult process of defining patch boundaries, followed by the equally laborous process of adjusting patch parameters to achieve the desired surface shape as well as surface continuity.

(3) Rigorous continuity of normal derivatives across patch boundaries is not achieved using current methods. Along the boundary between two patches the normal derivatives associated with the component surfaces may suffer a jump discontinuity. While this may not detract from the visualization of the surface as seen on a cathode ray tube, such a discontinuity does complicate the generation of machine tool paths needed to cut the surface onto a die. Indeed, a significant portion of a tool path generator, is devoted to the generation of "guard surfaces" for the purpose of making a safe transition from one surface patch to another.

(4) The current data structure is not well matched to the character of a typical inner panel surface. The geometric building blocks in the current data structure for inner panels are parametric surface patches defined on rectangular grids in the parameter space. Individual features on the full surface can be modeled only by assembling large numbers of these patches - 25 or so for the simplest rectangular pocket shape. Moreover, any additional downstream processing (for example, NC path generation) must be done one patch at a time.

SUMMARY OF THE INVENTION

The present invention provides a new approach to the design and representation of automobile inner panels which addresses the four key concerns expressed above. In accordance with the present invention we have created a feature based approach to the problem of inner panel design which has the following properties:

(1) Simplified design and modification capability. Surface feature details (e.g., pockets, ribs, embosses, channels) can be easily designed or modified with a minimal number of user-input specifications (for example, fillet radii, wall angle, pocket depth, etc.).

(2) Accurate control of surface shape and rigorous guarantee of surface smoothness. Given surfaces can be joined or blended along any user specified curve. The degree of smoothness or continuity of the designed surface can be easily controlled and is automatically guaranteed.

(3) Simplified NC-path generation. The continuously differentiable output surface can be treated as a single surface for NC path generation applications. This eliminates much work associated, for example, with the creation of guard surfaces within the usual tool path generator.

(4) Data structure is well suited to the character of inner panels. The geometric building block in the new data structure is a complete feature rather than a single patch. This leads to a more direct approach to the modeling of surface characteristics. It also provides a more efficient means of accessing pertinent surface information in pre- and post-processing operations.

In a broad sense, inner panel design is a process of combining a collection of specified surfaces to form a composite surface. This composite surface is comprised of a base or primary surface and a number of features, and satisfies certain functional objectives such as providing attachment surfaces on which to mount accessories. Inner panels exhibit a broad range of complexity—both in terms of number and types of features, and in terms of the nature of the component surfaces. Examples range from the fairly simple shapes associated with a floor pan to the more complex shapes needed for door inner panels. In the case of the floor pan, component surfaces are nearly parallel planes and feature shapes are predominantly rectangular. For the door inner panel, component surfaces include both analytic surfaces—planes and cylinders—as well as offsets of parametrically defined outer panels. Features also have more complex shape—ranging from simple rectangles, triangles, and circles to fairly complicated free-form geometries.

With current procedures, design of such panels often begins with a plan view drawing of the part. Such drawings show projections of theoretical intersection curves of the various known surfaces (primary and secondary) involved—a pocket top with a side wall, for example. This information is augmented with feature characteristics such as plan view radii at corners of the intersection curves, wall angles, fillet radii, offset distances, etc. Using only this limited amount of geometric information, the designer must create a smooth surface that adequately reflects the design specifications. With CAD tools now available this can be extremely time consuming and quite difficult. The designer must build each fillet, each pocket wall, each channel to specification by tailoring a patchwork surface, often, one patch at a time. The result, in the case of a simple rectangular feature is a surface composed of 25 patches. The designer must be concerned with the details of controlling patch shape as well as maintaining continuity of normals across patch boundaries. The designer must also be prepared to redo much of what has already been done if a specification change is introduced. Problems such as these are caused by the designer's need to make the patch representation "work" in an environment that is unsuited to its capabilities. In contrast, the present invention allows the designer to concentrate on the given feature specifications as the natural inputs to the process—not on the patch characteristics with which he now deals.

Many of the problems and goals in inner panel design are also common to the design of die addendum surfaces. Metal control surfaces must be added as modifications to an existing base surface in much the same way as features (pockets, channels, etc.) must be added to inner panel surfaces. The present invention is applicable to the design of such addendum surfaces.

The essential commonality in the design of inner panels is the fact—already stated—that inner panels are formed, from a given base surface, by taking pieces of known surfaces (the component surfaces) and blending them, under a few additional specifications, to the base surface along given curves (the feature boundaries) to create the required features. In accordance with the present invention, the inner panel design starts with a specified primary or base surface which is to be modified by introducing a single feature on the surface (for example, a pocket depression, raised emboss or a channel). Having built a single feature to specification on a base surface, this process can be repeated to design complex shapes, by simply treating the modified surface as a new base surface to be again altered through the blending of a new component surface along specified boundaries.

BRIEF DESCRIPTION OF THE DRAWINGS

The above and other advantages of the invention will become more apparent from the following description taken in conjunction with the accompanying drawings wherein like references refer to like parts and wherein.

DETAILED DESCRIPTION OF THE PRESENT INVENTION

Most often, a feature involves a specified secondary surface—for example, the floor of a pocket —which must be joined to a primary surface with a smooth transition occurring between two curves. One of these curves is specified on the primary surface to start the transition and the second is given on the secondary surface to complete the transition. Normally, both of these curves are known in terms of their plan view projections, are derivable from theoretical intersection curves, and may be given on engineering drawings which provide the part description. The method of the present invention creates, for a single feature, a smooth transition from the primary to the secondary surface between these curves.

Figure 1A:
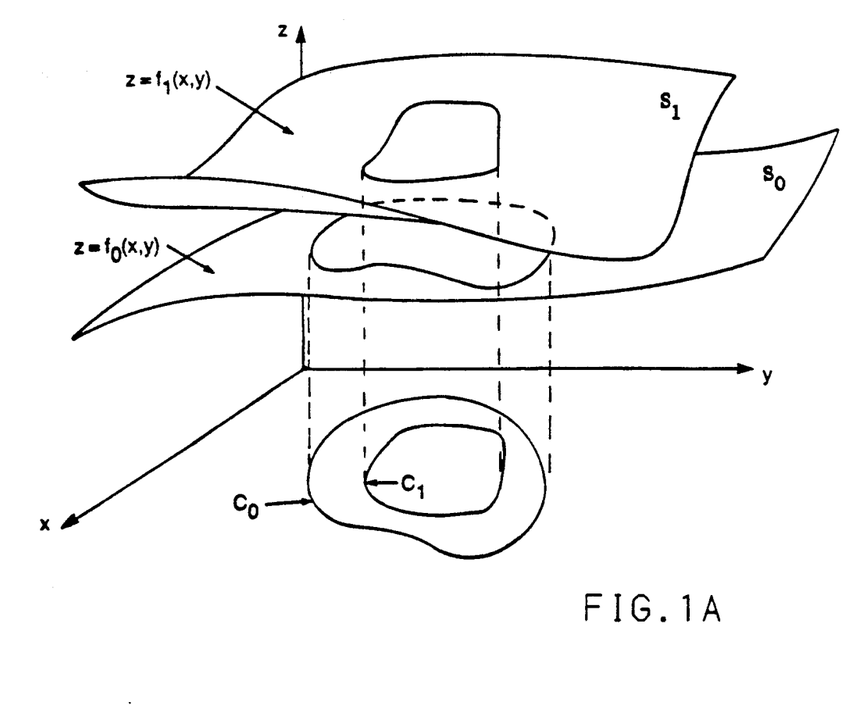
FIG. 1a shows primary and secondary surfaces prior to pocket construction.

Referring now to the drawings and initially to FIG. 1a, consider two specified surfaces; a primary surface $S_0$ and a secondary surface $S_1$. Assume that a plan-view of the desired composite surface—including the feature boundary curves—is presented in the xy-plane. This means that each surface $S_0$ and $S_1$—or at least the important portion of each surface—is representable in explicit form. That is, $S_0$ and $S_1$ can be described by functions $z=f_0(x,y)$ and $z=f_1(x,y)$, respectively. The procedures that allow for the inclusion of parametrically defined surface components will be discussed hereinafter.

Figure 1B:
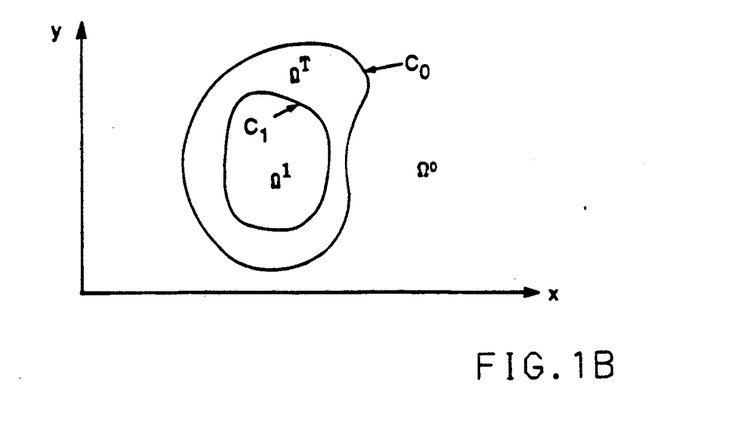
FIG. 1b is a plan view of feature boundaries for pocket construction.

Referring now to FIG. 1b, which shows the plan view of the desired composite surface, it will be noted that the projections of the feature boundary curves $C_0$ and $C_1$ divide the xy-plane into three parts. The region $\Omega^0$ outside the curve $C_0$, the region $\Omega^1$ inside the curve $C_1$, and the region $\Omega^T$ between the two curves. The object is to design a new surface $P_1$ which is equal to $S_0$ in $\Omega^0$, equal to $S_1$ in $\Omega^1$, and which makes a smooth transition between $S_0$ and $S_1$ in the region $\Omega^T$. This is accomplished by first defining a surface $$z = \Omega(x,y)$$

which solves the same problem as posed above, but with a primary surface given by the plane $z=0$, and with a secondary surface given by the plane $z=1$. In particular, $\Omega(x,y)$ is defined, imprecisely at first, $$\Phi(x,y) \begin{cases} = 0 \text{ if } (x,y)\epsilon\Omega^0 \\ \epsilon(0,1) \text{ if } (x,y)\epsilon\Omega^T \\ = 1 \text{ if } (x,y)\epsilon\Omega^1 \end{cases} \quad (1.1)$$

In (1.1), the notation $\Phi(x,y)\epsilon(0,1)$ is meant to suggest that $\Phi$ increases from 0 to 1 in the region $\Omega^T$. The precise manner in which $\Phi$ is constructed will be introduced hereinafter. The point now is that once such a smooth function $\Phi$ is available, one can solve the problem of interest. To do so the composite surface $P_1$ is defined by means of the explicit representation $z=g_1(x,y)$, where $g_1(x,y)$ is given by the formula:

$$g_1(x,y) = (1-\Phi(x,y))f_0(x,y) + \Phi(x,y)f_1(x,y). \quad (1.2)$$

Then, by virtue of the assumed behavior and properties of $\Phi$, the new surface $P_1:z=g_1(x,y)$ coincides with $S_0$ in $\Omega^0$, with $S_1$ in $\Omega^1$ and makes a smooth transition from $S_0$ to $S_1$ in the region $\Omega^T$. Indeed, $P_1$'s smoothness is automatic. This composite surface will have as many continuous derivatives as are common to each of the functions $f_0$, $f_1$ and $\Phi$. In the transition region, $P_1$'s shape is also determined by these three functions. If $S_0$ ($z=f_0(x,y)$) and $S_1$ ($z=f_1(x,y)$) are gently curved and approximately constant offsets of each other, as is frequently the case, then the shape of $P_1$ will be qualitatively similar to that of the surface $z=\Phi(x,y)$. In cases where $S_0$ and $S_1$ differ substantially from offset surfaces, the surface defined by (1.2) may be quite different from $\Phi$ and, to achieve desired shape properties, it may be necessary to modify (1.2) in the transition region. Methods for accomplishing this modification will be introduced hereinafter. For now, however, the simple formula (1.2) will be used.

The special function $\Phi(x,y)$ plays an obviously important role in the approach set forth thus far. Its cardinal properties—zero over certain parts of its domain, one on other designated parts—together with it's continuity characteristics serve to completely define, through the formula in (1.2), the transition from the primary surface $S_0$ to the secondary surface $S_1$ along the feature boundary curves. In the following, the term transition function is used to refer to $\Phi$.

Figure 2:
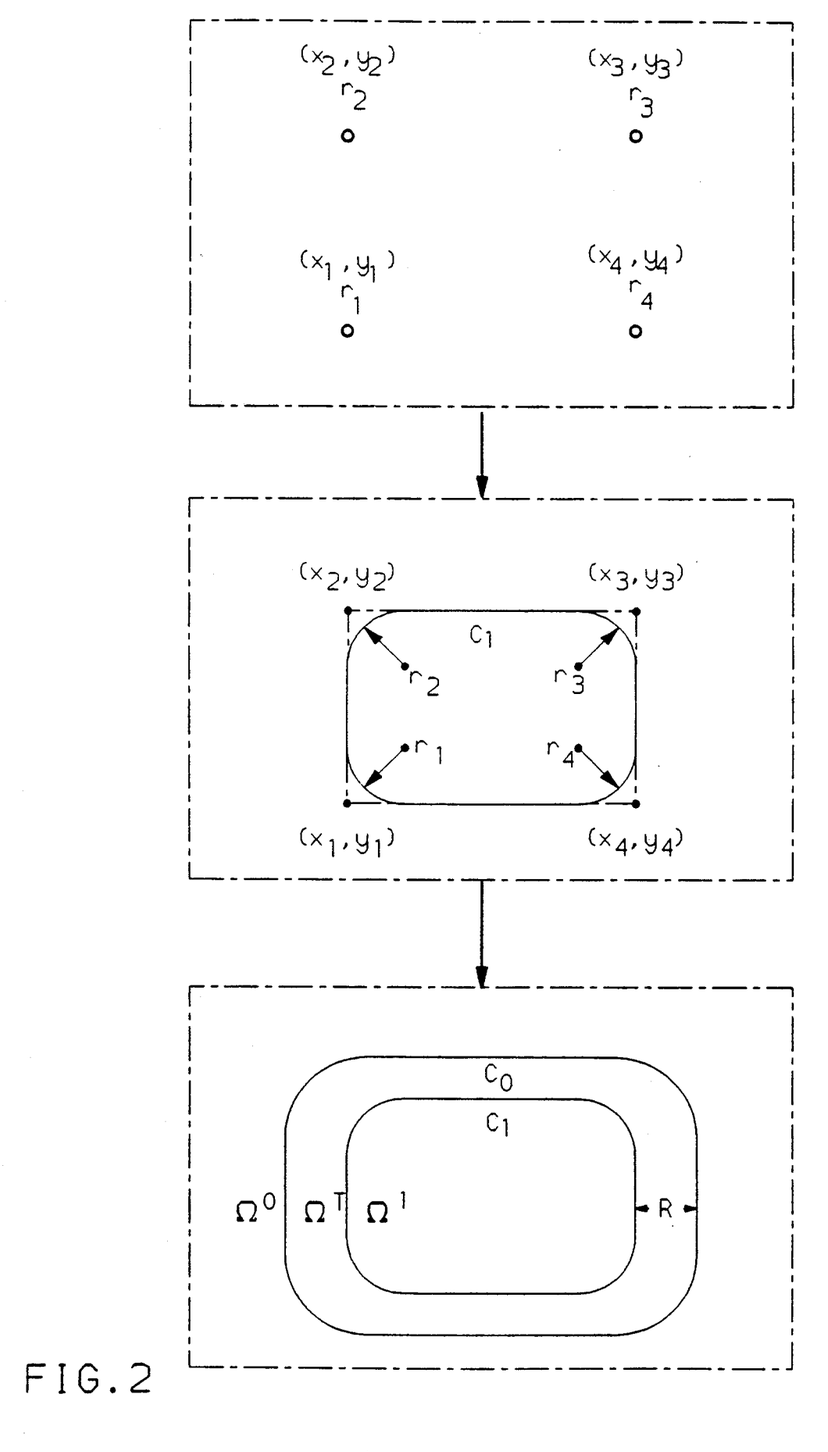
FIG. 2 shows the construction of feature boundary curves in plan view(convex shape)
Figure 3:
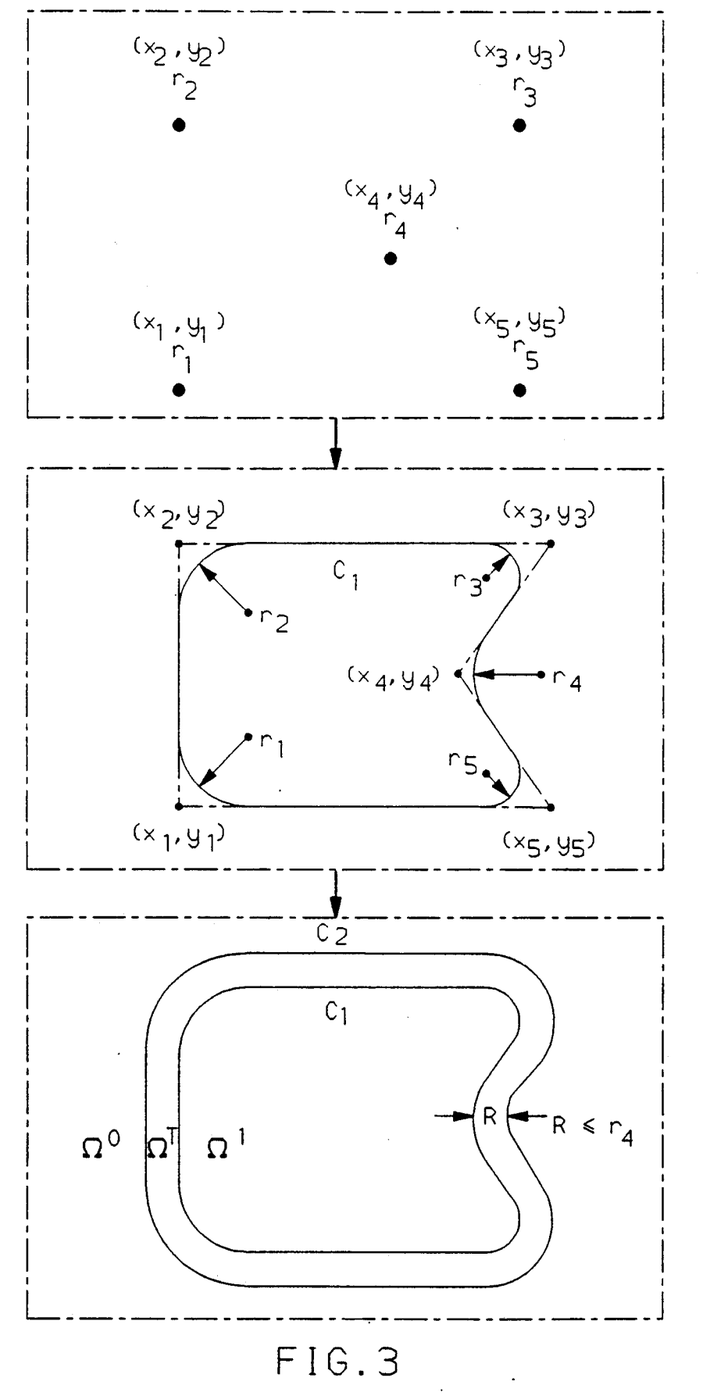
FIG. 3 shows the construction of feature boundary curves in plan view(non-convex shape)

Before illustrating the construction of a single pocket using the methods outlined so far, a description of how the pocket boundaries are specified in plan view will be presented. In part to facilitate data entry, but more importantly to allow for needed flexibility and to incorporate current inner panel design practices, the following method for specifying closed pocket boundaries in the xy-plane has been adopted. Referring to FIG. 2 for illustration, a sequence of vertices are input to define the approximate shape of the boundary curve $C_1$ (the inner boundary). For example, if the pocket is to be a rectangular shape—with rounded corners—the (x,y) coordinates of four vertices $$\{(x_i,y_i)\}_{i=1}^4$$

would be input to define a piecewise linear approximation to the intended inner curve. Then, to control the degree of rounding at each corner, four radii, $$\{(r_i)\}_{i=1}^4$$

are input. The sharp corners are automatically replaced by smoothly fitting (continuous tangent) arcs of circles with the designated radii of curvature to the adjacent sides. The final curve is thus defined in piecewise fashion as a composite of arcs of circles and straight lines. By way of specialization, the outer curve $C_0$ is obtained as a radial offset of the inner curve just constructed. This is done by displacing each point on the original curve $C_1$ by a given amount R, an input offset distance, in the direction of the unit outward normal to $C_1$. The offset curve constructed in this manner is also composed of arcs of circles and straight lines joined so that tangents are continuous. This specialization was adopted for coding convenience and because most inner panel features are delineated by such curves. This technique for defining the feature boundary curves in plan view is useful for convex shapes as well as shapes with reentrant corners, provided the offset is chosen small enough. See FIG. 3.

The main intent of the present invention is, of course, not merely to design single features on surfaces but rather, to provide a framework to enable the design of complex inner panel surfaces, consisting of multiple features, with much of the same convenience and operational simplicity as is apparent in the simple, single feature example given above.

Suppose that, in addition to the primary and secondary surfaces $S_0$ and $S_1$, there is also a surface $S_2$ ($z=f_2(x,y)$) which is to form the top or bottom of a second pocket. As in the case of a single pocket, the plan view projections of the pocket boundary curves for this second pocket divide the xy-plane into three regions $\Omega^0_2$, $\Omega^T$, and $\Omega^1_2$. These serve to define the support regions of the transition function $\Phi_2$ for the second pocket. The formalism associated with adding a second pocket to the primary surface $S_0$ is the same as the formalism for adding a single pocket to the modified surface $P_1$, whose explicit representation is given by $z=g_1(x,y)$ in equation (1.2). With $z=g_1(x,y)$ assuming the role of the primary surface and $z=f_2(x,y)$ taking the role of the secondary surface, the blending rule of (1.2) is used with the transition function $\Phi_2$ to obtain the following expression for the twice modified surface $$P_2: z = g_2(x,y):$$

$$g_2(x,y) = (1-\Phi_2(x,y))g_1(x,y) + \Phi_2(x,y)f_2(x,y) \quad (1.3)$$

Figure 4A:
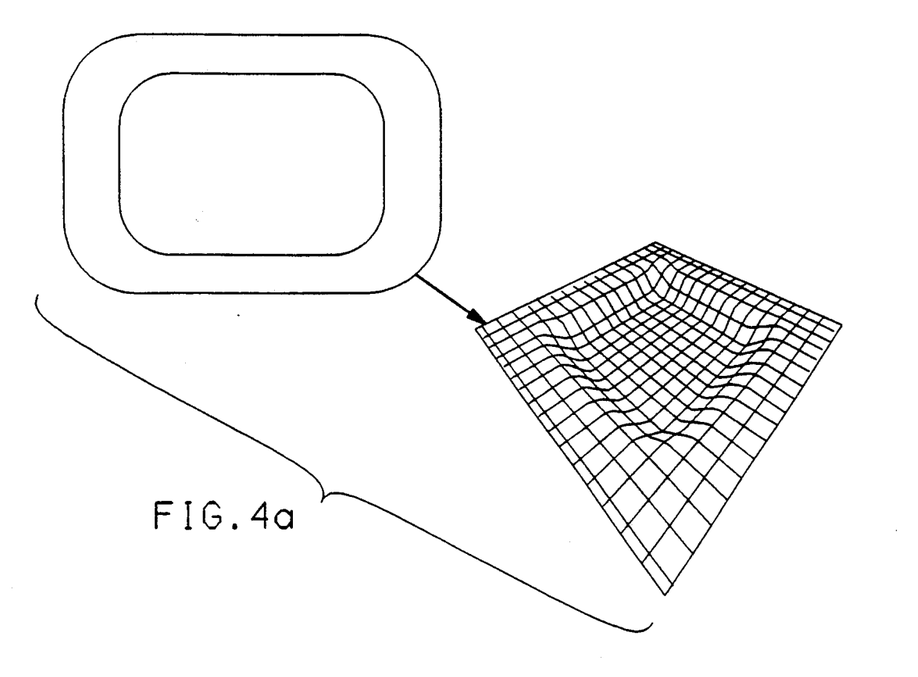
FIGS. 4a shows the construction of a single feature, 4b shows the construction of multiple feature.
Figure 4B:
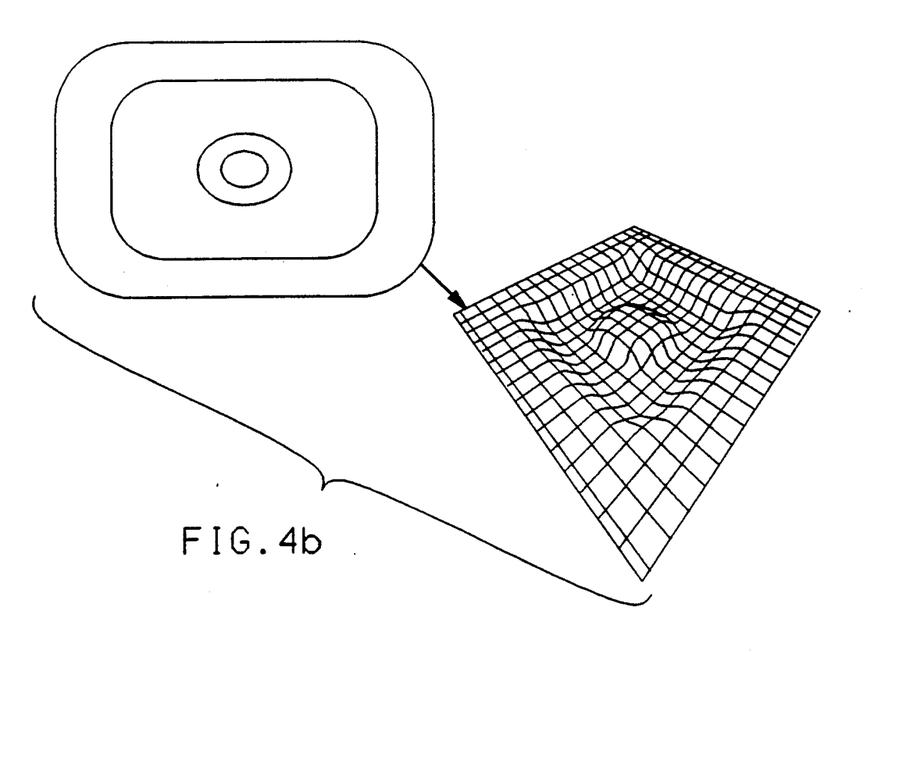

This sequence of operations is illustrated in FIG. 4 where a raised circular pocket with a planar top has been added in FIG. 4b to the previously constructed rectangular pocket in FIG. 4a.

Further generalization of this recursive strategy for feature design is straightforward. We proceed as follows if the intent is to design a panel involving a base surface $S_0:z=f_0(x,y)$ with N features whose tops or bottoms are the component surfaces $S_i:z=f_i(x,y)$, $i=1, \ldots, N$.

First define N transition functions, $\Phi_i$, $i=1, \ldots, N$, corresponding to the shape of each feature. The $\Phi_i$'s depend only on the plan view boundaries of the i'th feature, not on any of the component surfaces. Next, define N intermediate surfaces, $P_i:z=g_i(x,y)$, $i=1, \ldots, N$ via the recurrence:

$$g_0(x,y) = f_0(x,y)$$

$$g_i(x,y) = (1 - \Phi_i(x,y))g_{i-1}(x,y) - \Phi_i(x,y)f_i(x,y). \quad (1.4)$$

The desired surface is the last computed element of this recurrence; the surface $P_N$ represented by $z = g_N(x,y)$. Note that, if none of the features overlap - in the sense that all the products $\Phi_i\Phi_j = 0$, $i \neq j$ - then the final surface $g_N(x,y)$ does not depend on the order in which the features are added. If certain features do overlap, then order is important —the last feature built will dominate.

The methods outlined above are intended to "assemble" inner panel surfaces from a relatively small data base consisting of plan view feature boundaries, wall angles, fillet radii, offset distances, etc.. The methods assume certain component surfaces (base surfaces, pocket tops or bottoms, etc.) are known and explicitly representable with respect to an orthogonal coordinate system in the plan view plane.

Current inner panel design practices which naturally complement this feature based approach include design initiated from plan view engineering drawings and designs originating from wire frame models. The utility of the plan view specification of inner panel surfaces and its relation to the new approach was discussed earlier. Below, the role of the wire frame model is reviewed.

The wire frame model is a 3-D network of curves which provides a skeletal outline of the surface. In a wire frame model of a door inner panel, the curves are defined by executing certain operations (for example, intersections, projection, and offsets) on various geometric entities - straight lines, circular arcs, planes, cylinders, surfaces of revolution and parametric surfaces. The wire frame is useful for visualizing the panel, for interference checking, and for generating prototype hard models of the panel. The main point here is that surface components making up the target primary and secondary surfaces for the wire frame are known prior to the construction of the wire frame. What is not known is how to make a smooth transition from one known component surface to another. We advocate retaining the wire frame, but in a simpler form. Many of the curves shown in a wire frame model are intended only to permit better visualization of the surface. Information essential to our new approach includes curves constructed to define feature boundaries but does not include curves intended to enhance surface visualization. Following this, 3-D wire frames, showing only essential feature outlines and accompanied by additional descriptions of surface components, could then be projected to a designated plan view plane to initiate the new surface construction techniques.

While the above description conveys the basic details of the feature based inner panel design methods of the present invention, a discussion of the following three issues will provide a more complete understanding of the mathematical details associated with the formulation of these methods. In (a) below we describe precisely how the transition functions $\Phi(x,y)$ are constructed. In (b) we describe two techniques which are useful for achieving certain shape requirements in transition regions. In (c) the procedures that allow for the inclusion in our method of parametrically defined surface components are discussed.

(a) Constructing transition functions.

The construction techniques given below concentrate on defining transition functions from plan view feature boundaries that are closed curves with the outer boundary curve ($C_0$) being a constant radial offset of the inner curve. The techniques serve, however, to establish the main ideas and demonstrate, for an important class of surface design problems, the utility of our approach.

Construction of $\Phi(x,y)$ begins with the assumption that the inner curve of FIG. $1b.(C_1)$, is described parametrically by:

$$C_1: (x_1(s), y_1(s)), \; s \in [0, L].$$

For the time being suppose that, in addition to being smooth, $C_1$ is also convex (that is, no reentrant corners). Then we can generate the family of radial offset curves $\{C_{1,r} : r > 0\}$ defined by:

$$C_{1,r}: (x_1(s) + rn_x(s), y_1(s) + rn_y(s)), \; s \in [0, L]$$

where $(n_x(s), n_y(s))$ are the components of the unit outward normal to $C_1$ at the parameter value $s$. We can also define such a family for a nonconvex curve $C_1$ provided we limit the maximum value of $r$. The original inner boundary $C_1$ coincides with the member $C_{1,0}$. In our initial specialization we have also assumed that the outer curve $C_0$ (see FIG. 1$b$) belongs to this family. That is $$C_0 = C_{1,R} \text{ for some offset } R > 0.$$

This specialization, aside from providing some convenience in computer implementation, is in line with realistic construction techniques related to maintaining a given feature wall angle during a filleting operation.

Now note that the family $\{C_{1,r} : r > 0\}$ covers the transition region. That is, any point $(x,y) \in \Omega^T$ is associated uniquely to a parameter value $s \in [0,L]$ and an offset distance $r \in [0,R]$ in the sense that the equation:

$$(x,y) = (x_1(s) + rn_x(s), y_1(s) + rn_y(s)) \quad (2.1)$$

is satisfied for exactly one point $(r,s) \in [0,R] \times [0,L]$. The correspondence which associates to each $(x,y) \in \Omega^T$, a pair $(r,s) \in [0,R] \times [0,L]$ is denoted by:

$$r = r_T(x,y)$$

$$s = s_T(x,y) \quad (2.2)$$

Efficient evaluation of this correspondence is essential to the overall efficiency of our method. Excellent results can be obtained by using the special, but highly flexible class of boundary curves described above coupled with a natural approximation of the transition region $\Omega^T$ by polygons. This combination permits efficient point-in-polygon techniques, (see S. Nordbeck and B. Rystedt, "Computer Cartography Point-in-Polygon Program", BIT, Vol. 7, pp. 39–64 (1967), to be used to locate a point $(x,y)$ relative to the local parametric description of the boundary curves.

The differentiability of the mapping (2.2) is determined via (2.1), by the smoothness of the inner curve $C_1$. If $C_1$ has a continuously turning tangent and piecewise continuous curvature, then the partial derivatives of $r_T$ with respect to $x$ and $y$ are continuous functions of $x$ and $y$ in $\Omega$. If, in addition, we assume that $C_1$ has continuous curvature, then the partial derivatives of $r_T$ with respect to $x$ and $y$ are continuous as well. In our implementation, the inner curve is a composite of circular arcs and straight lines with continuous tangent and piecewise continuous curvature. Thus, of the two components in the correspondence (2.2), only $r_T(x,y)$ will be continuously differentiable. As will be shown below, this fits well with the remaining elements of the construction of $\Phi(x,y)$.

The correspondence (2.2), together with one additional construction will complete the definition of $\Phi$. The remaining construction is that of a univariate function $h:[O,R]\to[O,1]$, which blends the surface $z=0$ to the surface $z=1$ smoothly along lines of constant s in the parameter space $[O,R] \times [O,L]$. We define $h(r)$ to be the cubic Hermite polynomial which satisfies the endpoint conditions $h(O)=1$, $h'(O)=0$, $h(R)=0$, and $h'(R)=0$. Specifically, $$h(r) = ((R-r)/R^2(3-2((R-r)/R)) \tag{2.3}$$

With this, we give the following definition of the transition function $\Phi$.

$$\Phi(x,y) = \begin{cases} 0 & \text{if } (x,y)\epsilon\Omega^0 \\ h(r_T(x,y)) & \text{if } (x,y)\epsilon\Omega^T \\ 1 & \text{if } (x,y)\Omega^1 \end{cases} \tag{2.4}$$

The surface defined by $z=\Phi(x,y)$ does what was originally intended. It is smooth - with one continuous normal derivative - as a result of the smoothness of $h(r)$ and $r_T(x,y)$. It is monotone in $\Omega^T$ along lines of constant "s" and it blends the surfaces $z=0$ and $z=1$ along the designated curves.

As the construction given above shows, the assumption that the outer curve is a constant normal offset of the inner curve is an important one. It suggests a natural, local coordinate system for $\Omega^T$, it enables a simple and intuitive correspondence to be established, via (2.1), between the Cartesian coordinates $(x,y)$ and the local coordinates $(r,s)$ and it allows $\Phi$ to be defined by means of an auxiliary univariate function depending only on $r_T(x,y)$. In a more general setting where the inner and outer curves are not related in this simple way, we can still devise an analogous construction for $\Phi(x,y)$ provided a position on the inner curve can be suitably related to a position on the outer curve by some other means.

The univariate cubic function h defined in (2.3) was chosen, in part, for convenience of computer implementation. However, other choices are possible and may indeed be preferable in order to achieve different objectives. For example, smoothness can be increased by defining $C_1$ to be curvature continuous and h to be the quintic polynomial interpolating additional endpoint conditions:

$$h(O) = 1 h'(O) = h''(O) = O$$

$$h(R) = h'(R) = h''(R) = O$$

The function h might also be defined in piecewise fashion to consist of a circular arc of specified radius, followed by a straight line, followed by a second circular arc, possibly of different radius. In this way $\Phi$ would consist, in the transition region, of two constant radius fillets connected by a surface whose angle with the xy-plane is constant. This particular construction can be used for many panel features to define a transition surface that closely approximates a type of surface often called for in engineering practice: a lateral filleted wall.

The particular choice of h in a given application may depend on how important it is to achieve specific shape objectives in the transition region. In some examples, shape may be only loosely specified—fillet radius larger than a certain value, wall angle between two tolerable values, etc. In these cases any of the options listed above should be acceptable. In situations where surface shape in the transition region must be more exactly specified, one choice may be better than the others. In some cases, as was pointed out above, it may be necessary to modify the transition surface in other ways. The methods for accomplishing this will now be discussed.

(b) Modifying surface shape in the transition region.

Surface shape in the transition region is determined, according to formula (1.2), by three functions. The function $z=f_0(x,y)$ describing the base surface $(S_0)$, the function $z=f_1(x,y)$ giving the component surface $(S_1)$ and the relation $z=\Phi(x,y)$ defining the transition function. If the surfaces $S_0$ and $S_1$ are planes parallel to the plan view plane $(z=0)$, then the surface $z=g_1(x,y)$ defined by (1.2) is simply a scaled version of $z=\Phi(x,y)$. In this case, surface shape is completely determined by $\Phi$. In typical situations $S_0$ and $S_1$ are not precisely planar, nor are they exactly parallel to the plan view plane. However, they are frequently only gently curved, nearly parallel to the plan view, and approximately constant offsets of each other. Under these circumstances, the simple behavior of the transition function will be inherited, in an approximate sense, by the surface defined by (1.2). This is very desirable because it permits us to control the shape of the transition surface through control of the shape of $\Phi$ only. And, as indicated above, $\Phi$ can assume one of several simple designated forms, including one that produces filleted pocket wall shapes often prescribed by current engineering design practice. If, however, the surfaces $S_0$ and $S_1$ are rapidly changing in the transition region $\Omega^T$, or if these surfaces intersect in $\Omega^T$, this will not be the case. It may instead happen that (1.2)'s shape is not well predicted by the shape of $z=\Phi(x,y)$. Thus, it may be necessary to change the shape of (1.2) inside the transition region. Additional modification may be accomplished in several ways. Two approaches are discussed below.

The first approach for achieving precise shape objectives in the transition region - e.g., constant wall angle, specified fillet radius, etc.—involves the concept of a modifying function such as was proposed by J. P. Duncan and G. W. vickers, "Simplified Method for Interactive Adjustment of surfaces, "CAD, Vol 12, Number 6, November 1980. Briefly, we modify (1.2) to assume the form:

$$g_1(x,y) = (1-\Phi(x,y))f_0(x,y) + \Phi(x,y) f_1(x,y) + \Psi_m(x,y) \tag{2.5}$$

where the modifying function $\Psi_m$ is smooth and nonzero only in the transition region $\Omega^T$. The basic idea in this approach is to use the first two terms of (2.5) to achieve the smooth blend of surface $S_0$ with surface $S_1$ along the designated boundaries and then adjust $\Psi_m$ to impart particular shape characteristics to the surface within the transition region. Since $\Psi_m$ is nonzero only in $\Omega^T$, no change will occur outside this region.

Although there is considerable flexibility in choosing $\Psi_m$, one particularly useful option is to define $\Psi_m$ to be a piecewise polynomial tensor product surface in the local variables $(r,s)$ associated with the transition region in question. As will be shown below, this option generally requires that $\Psi_m$ depends on both $r_T(x,y)$ and $s_T(s,y)$. In order for $s_T(x,y)$ to be continuously differentiable as a function of x and y the inner curve, $C_1$, must be curvature continuous. In the following definition of $\Psi_m$ it will be assumed that $C_1$ is defined so that curvature is continuous.

Figure 5:
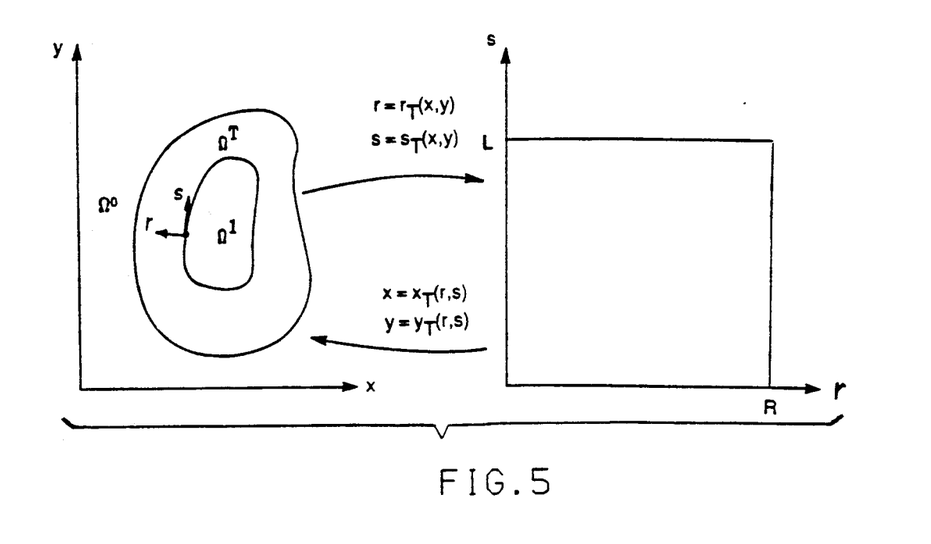
FIG. 5 is a diagram useful in explaining the correspondence between r,s and x,y.

Recall that through the correspondence (2.2), the transition region $\Omega^T$ is represented in the rs-plane as a rectangle $[O,R]X[O,L]$. See FIG. 5. If we partition $[O,R]$ according to $O=r_1<r_2<\ldots<r_N=R$, and $[O,L]$ by $O=s_1<s_2<\ldots<s_M=L$, then letting $\eta_i(r)$, $i=1,\ldots,N+2$ and $\zeta_j(s)$, $j=1,\ldots,M+2$ be, respectively, the cubic B-splines associated with these partitions, see C. deBoor, A Practical Guide to Splines, Prentice-Hall, New Jersey, 1978, we may define $\Psi_m$ as the tensor product:

$$\Psi_m(x,y) \begin{cases} 0, \text{ if } (x,y)\epsilon\Omega^0 \\ \sum_{i=1}^{N+2}\sum_{j=1}^{M+2} q_{ij}\eta_i(r_T(x,y))\zeta_j(s_T(x,y)), \text{ if } (x,y)\epsilon\Omega^T \\ 0, \text{ if } (x,y)\epsilon\Omega^1 \end{cases}$$

where we set $q_{1j}=q_{2j}=q_{N-1j}=q_{N-2j}=0$, $j=1,\ldots,M+2$ to insure that both $\Psi_m$ and it's first derivatives vanish at the boundaries of $\Omega^T$. To guarantee that $\Psi_m$ is periodic and smooth in the variable "s", we impose the additional requirements that $q_{i1}=q_{iM-2}$ and $q_{i2}=q_{iM-1}$. In this way $\Psi_m$ is defined over the entire xy-plane, has one continuous derivative, and is non zero only in transition region $\Omega^T$. It's shape is flexible and may be adjusted through the coefficients $q_{ij}$. This flexibility can be exploited, either through approximation or interpolation techniques, to achieve desired transition surface shape properties with the surface defined by (2.5). We note, finally. that it is not essential that the tensor product be formed using cubic B-splines. In some cases Hermite cubics or higher order splines may be appropriate.

One additional, particularly suitable approach along these lines. is to define a modifying function in terms of the already defined transition function. Specifically, $$\Psi_m(x,y) = \begin{cases} 0, \text{ if } (x,y)\epsilon\Omega^0 \\ \sum_{i=1}^{N-1} C_i(1 - \Phi(x,y))^i(\Phi(x,y))^{N-i} \text{ if } (x,y)\epsilon\Omega^T \\ 0, \text{ if } (x,y)\epsilon\Omega^1 \end{cases} \quad (2.6)$$

where $C_i$, $i=1\ldots N$ are smooth coefficient functions of $(x,y)$. This gives the capability of quickly creating a modifying function with the required properties.

Most of the normal demands of inner panel design can be achieved through the recursive application of the simple formula (1.2). For those few surface features for which this is not the case, the simple alternative modification techniques described in this section will produce desired transition surface shapes.

(c) Using parametric surfaces.

The examples given to illustrate our method have, so far, always involved primary and secondary surface components described explicitly via analytic expressions of the form $z=f(x,y)$. In practice, however, some of the component surfaces will be defined parametrically (for example, Gordon, Bezier or NURBS surfaces). That is, instead of an explicit formula giving z as a function of x and y, the available description is of the form:

$$x = X(u,v)$$
$$y = Y(u,v)$$
$$z = Z(u,v) \quad (2.7)$$

where u and v are parameters ranging over a rectangular domain, $u \epsilon[a,b]$, $v \epsilon[c,d]$. In (2.7) we assume that the coordinates (x,y,z) are relative to a given plan view orientation.

To use a surface represented parametrically in the manner of (2.7) with our feature based methods, it is necessary to duplicate the effect of an equivalent, explicit representation by numerical means. That is, given a point $(x_0,y_0)$ in the plan view plane, we must find the z-value, $z_0$, so that $(x_0,y_0,z_0)$ is on the given parametric surface. This means that we must first find corresponding parameter values $(u,v) \epsilon[a,b]X[c,d]$ which satisfy the equations:

$$x_0 = X(u,v)$$
$$y_0 = Y(u,v) \quad (2.8)$$

Once this is done, the appropriate z-value, $z_0$ can be determined from the last equation in (2.7):

$$z_0 = Z(u,v)$$

The basic requirement is then to solve the system of equations (2.7). Geometrically, this is equivalent to finding the intersection of the line $L_0:(x_0,y_0,\lambda)$, $-\infty < \lambda < \infty$ with the surface defined by (2.7), (see FIG. 6). Thus it is possible that standard operators can be used to solve the problem. For our system, however, we have adopted a Newton iteration to solve the nonlinear system (2.8).

Figure 6:
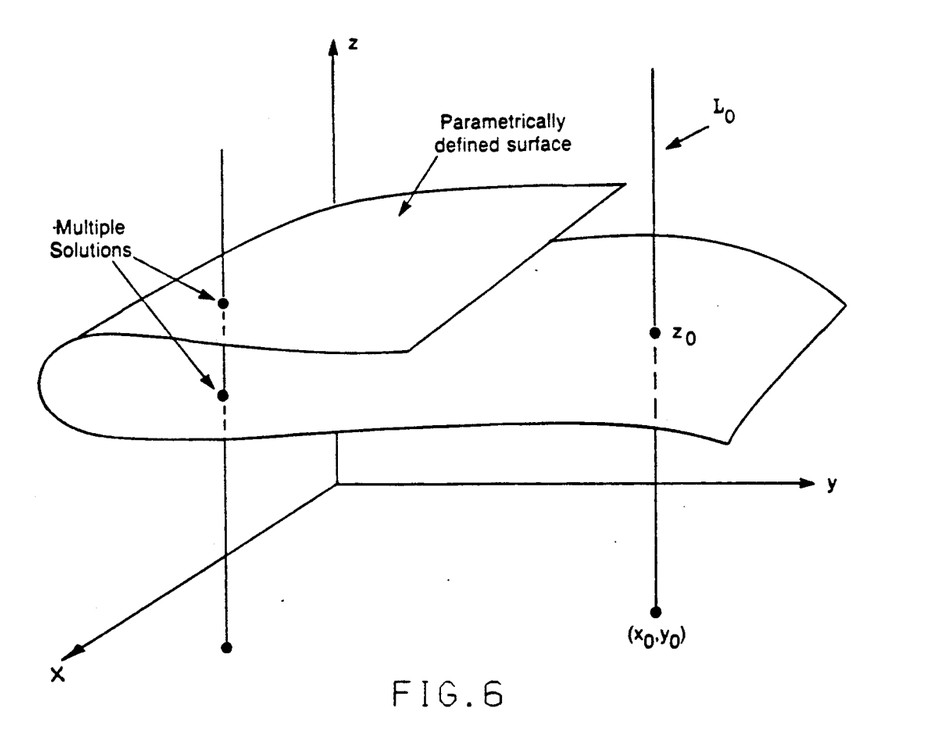
FIG. 6 depicts the application of the invention to a parametric surface.

Before attempting to solve (2.8) we should gain assurance that, first, a solution exists and second, that the solution is unique. The concern for existence recognizes the fact that surfaces defined parametrically are generally of finite extent. An existence requirement is then merely a demand that the parametric component surface extend sufficiently, or be properly positioned, to cover the appropriate regions in the plan view plane. We assume that this is satisfied. The second concern, for uniqueness, acknowledges the fact that parametrically defined surfaces may turn over on themselves, making multiple solutions of (2.7) possible. This is illustrated in FIG. 6. To deal generally with the second concern, problem (2.8) would have t be re-posed to include additional restrictions on admissible parameter values. In particular, we would have to restrict the solution search to a subregion, U, of the full parameter space—one that corresponds to the desired "layer" of the parametric surface in question. The appropriate problem to consider would then be of the form:

Find $(u,v) \epsilon U \epsilon[a,b]X[c,d]$ so that:

$$x_0 = X(u,v)$$
$$y_0 = Y(u,v)$$

Having exposed this issue, mainly to guide a future, more complete treatment, we turn back to the basic problem of solving (2.8) under the assumptions of existence and uniqueness.

As noted above, we solve the system (2.8) for u and v, given $x_0$ and $y_0$, by means of a standard Newton iteration. To illustrate the procedure, we have chosen a parametric, tensor product, cubic B-spline surface defined on the parametric domain $(u,v) \epsilon [0,1] \times [0,1]$ and given by:

$$x = \sum_{i=1}^{5} \sum_{j=1}^{5} x_{ij} \zeta_i(u) \eta_j(v) \quad (2.9)$$

$$y = \sum_{i=1}^{5} \sum_{j=1}^{5} y_{ij} \zeta_i(u) \eta_j(v)$$

$$z = \sum_{i=1}^{5} \sum_{j=1}^{5} z_{ij} \zeta_i(u) \eta_j(v)$$

Figure 7:
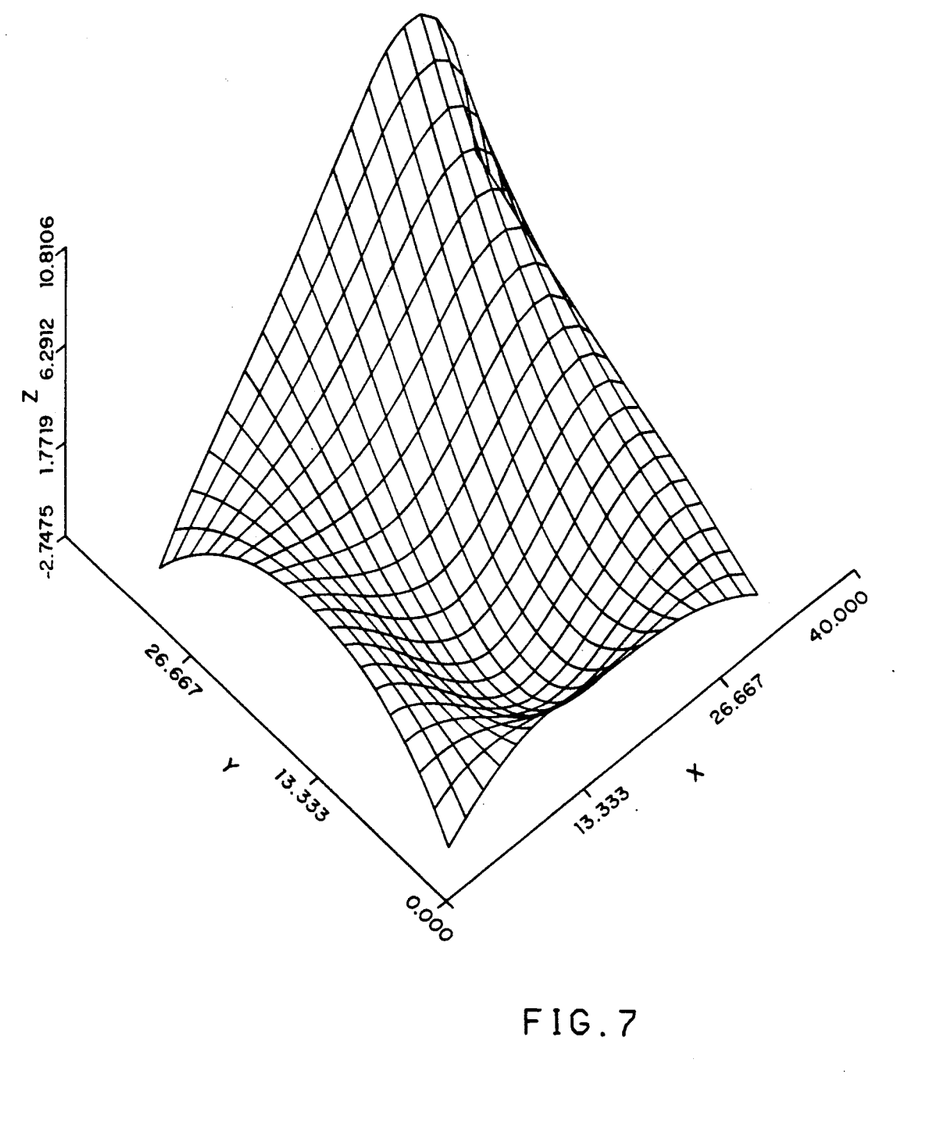
FIG. 7 shows a tensor product B-spline surface.

Here, $\zeta_i(.) \; i = 1, \ldots, 5$ as well as $\eta_j(.), j = 1, \ldots, 5$ are the cubic B-splines on [0,1] having breakpoints at 0, $\frac{1}{2}$, and 1. This surface is plotted in FIG. 7 using representative coefficients $x_{ij}, y_{ij}$, and $z_{ij}$ in (2.9). The axis scales have been adjusted in this figure to emphasize the free form character of the surface.

Figure 8:
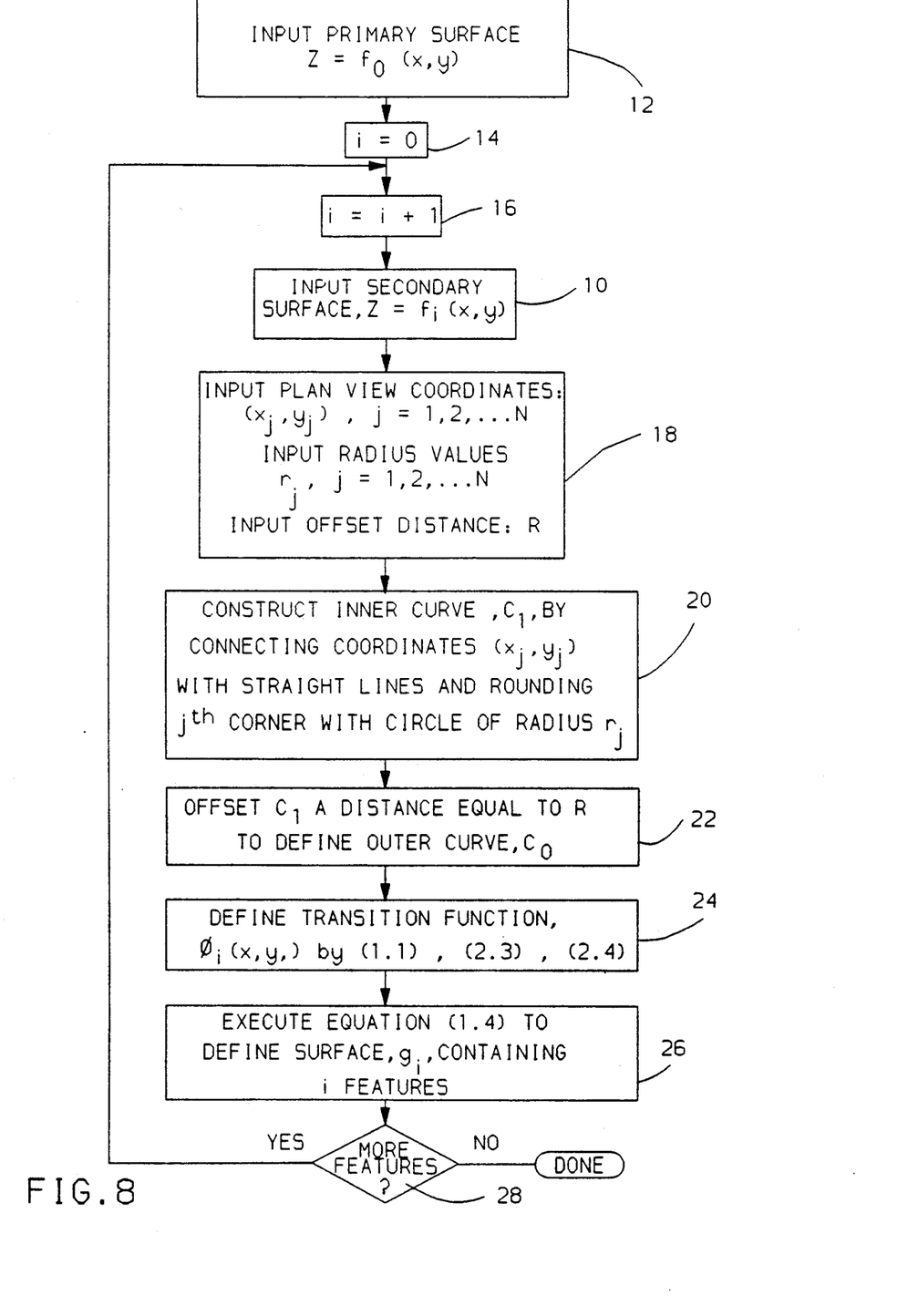
FIG. 8 is a flow chart of method of the present invention.

To summarize implementation details, reference is made to the flow chart of FIG. 8. With the method of the present invention, geometric feature are designed into a primary base surface - one feature at a time. Consequently, computer input is organized and entered sequentially in blocks of data with each block corresponding to a single feature. As indicated in block 10, in order to integrate the ith feature into a surface (that is, in order to execute the ith recursion in Equation 1.4), input information must be entered to define the ith pocket top or bottom surface, $f_i(x,y)$, and the transition function $\Phi_i(x,y)$ (when $i=1$, the primary surface $f_0(x,y)$ must also be defined as shown in block 12). Blocks 14 and 16 represent a counter that is reset and then incremented as each feature is sequently build. $\Phi_i$ is constructed from input data used to define $\Omega^T$, the transition region appropriate for the ith feature. Therefore, the ith feature to be assembled into a surface design can be represented by a pair, $(f_i, \Omega^T_i)$, and the block of input data associated with this feature is that required to define $f_i$ and $\Omega^T_i$.

There are many types of design input specifications that can be used to designate primary and secondary surfaces, and their specifications will generally depend on the types of surfaces used to represent these pocket floors or tops (for example, planes, cylinders, spheres, parametric surfaces).

As indicated in block 18, a sequence of vertices are input followed by plan view radii and finally an offset distance R. In block 20 the inner boundary curve $C_1$ for the ith feature is constructed. In block 22 the outer curve $C_0$ is defined by offsetting $C_1$ by the distance R. Care must be taken that R does not exceed the minimum value of the $r_i$ corresponding to re-entrant corners. $\Omega^T_i$ defined in block 24 by executing the equation (1.1) or alternatively (2.4). Finally, equation 1.4 is executed to define the surface containing the ith feature as shown in block 26. As indicated at 28 the process is continued until all features have been included in the composite surface. In this manner complex multi-featured inner panel geometries can be constructed by recursively inputting simple design information for each feature.

The embodiments of the invention in which an exclusive property or privilege is claimed are defined as follows:

1. A method of creating and machining a three dimensional composite surface on a workpiece using a computer, said composite surface being defined by a function $z = g_1(x,y)$ containing a primary surface $S_0$ defined by a function $z = f_0(x,y)$, a secondary surface $S_1$ defined by a function $z = f_1(x,y)$, and which makes a smooth transition between $S_0$ and $S_1$, comprising the steps of:
   a. entering into said computer a plurality of coordinate data points $x_j, y_j, j = 1,2, \ldots N$
   b. connecting said data points in the xy-plane with straight lines and rounding the $j^{th}$ corner of the thereby defined polygon with a circle of radius $r_j$ to define a smooth closed curve $C_1$,
   c. offsetting $C_1$ by a predetermined amount R to define a closed curve $C_0$,
   d. generating output data which defines the composite surface as coinciding with $S_0$ in the region outside the curve $C_0$, coinciding with $S_1$ in the region inside the curve $C_1$, and making a smooth transition from $S_0$ to $S_1$ in the region between $C_0$ and $C_1$.
   e. machining the workpiece in accordance with said output data.

2. The method as defined in claim 1 in which the workpiece is used to manufacture an automotive inner panel.

3. A method of creating a three dimensional composite surface and machining the surface on a workpiece using a computer, said composite surface defined by a function $z = g_1(x,y)$ and comprising a primary surface $S_0$ defined by the function $z = f_0(x,y)$, joined smoothly to a secondary surface $S_1$ defined by the function $z = f_1(x,y)$, comprising the steps of:
   a. inputting a plurality of coordinate data points $(x_j, y_j), j = 1,2, \ldots N$, inputting corner radius values $r_j, j = 1,2, \ldots N$, and inputting an offset distance R,
   b. connecting the data points with straight lines, and rounding the $j^{th}$ corner $(j = 1,2, \ldots N)$ of the thereby defined polygon with a circle of radius $r_j$ to define a smooth curve $C_1$,
   c. defining a smooth closed curve $C_0$ by offsetting $C_1$ in the xy-plane a distance R,
   d. processing the data input from step a to define a transition function $Z = \Phi(x,y)$ having values $Z = 1$ for xy-coordinates inside $C_1$, $Z = 0$ for xy-coordinates outside $C_0$, and values of Z that increases from 0 to 1 for coordinates inside the region existing between the two curves $C_0$ and $C_1$ in the xy-plane,
   e. generating output data defining the composite surface which coincides with $S_0$ for xy-coordinates in the region outside the curve $C_0$, coincides with $S_1$ for xy-coordinates int eh region inside the curve $C_1$ and makes a smooth transition between $S_0$ and $S_1$ in the region between the two curves $C_0$ and $C_1$ in accordance with the formula $$g1(x,y) = (1 - \Phi(x,y))f_0(x,y) + \Phi(x,y)f_1(x,y)$$

f. machining the workpiece in accordance with said output data.

4. The method defined by claim 3 comprising the further step of iteratively performing steps a-e to generate a collection of secondary surfaces defined by $Z = f_i(x,y), i = 1,2, \ldots N$, transition regions $\Omega^T_i, i = 1,2, \ldots$ . N and transition functions $Z = \Phi_i(x,y)$ all for the purpose of generating composite surfaces defined by $Z = g_i(x,y)$, each said surface containing exactly i features in accordance with the formula:

$$g_i(x,y) = (1 - \Phi_i(x,y))g_{i-1}(x,y) + \Phi_i(x,y)f_i(x,y)$$

$$i = 1,2, \ldots N$$

where $g_0(x,y) = f_0(x,y) =$ primary surface.

5. The method as defined in claim 4 in which the workpiece is used to manufacture an automotive inner panel.

6. The method defined by claim 3 comprising the further step of iterativley performing steps a–e to generate a collection of secondary surfaces defined by $Z = f_i(x,y)$, $i = 1,2, \ldots N$, transition regions $\Omega^T_i$, $i = 1,2, \ldots N$ and transition functions $Z = \Phi_i(x,y)$ all for the purpose of generating composite surfaces defined by $Z = g_i(x,y)$, each said surface containing exactly i features in accordance with the formula:

$$g_i(x,y) = (1 - \Phi_i(x,y))g_{i-1}(x,y) + \Phi_i(x,y)f_i(x,y) + \Psi_i(x,y)$$

$$i = 1,2, \ldots N$$

where $g_0(x,y) = f_0(x,y) =$ primary surface and $\Psi_i(x,y)$ is any smooth function whose value is non zero only in the transition region $\Omega^T_i$.

7. The method as defined in claim 6 in which the workpiece is used to manufacture an automotive inner panel.

8. The method as defined in claim 3 in which the workpiece is used to manufacture an automotive inner panel.

9. A method of creating a three dimensional composite surface and machining the surface on a workpiece using a computer, said composite surface being defined by a function $Z = g_1(x,y)$ and comprising a primary surface $S_0$ defined by the function $z = f_0(x,y)$, joined smoothly to a second lay surface $S_1$ defined by the function $z = f_1(x,y)$ comprising the steps of:

a. inputting a plurality of coordinate data points $(x_j, y_j)$ $j = 1,2 \ldots N$, inputting corner radius values $r_j$, $j = 1,2 \ldots N$, and inputting an offset distance R, b. connecting the data points with straight lines and rounding the jth corner $(j = 1,2, \ldots N)$ of the thereby defined closed polygon, c. defining a smooth closed curve $C_0$ by offsetting $C_1$ in the xy-plane a distance R, d. processing the data input from step a. to define a transition function $Z = \Phi(x,y)$ that is defined by;

$$\Phi(x,y) = \begin{cases} 0 \text{ for } (x,y) \text{ inside } \Omega^0 \\ h(r(x,y)) \text{ if } (x,y) \text{ inside } \Omega^T \\ 1 \text{ if } (x,y) \text{ inside } \Omega^1 \end{cases}$$

where
$\Omega^0$ is the region in the xy-plane outside the curve $C_0$, $\Omega^1$ is the region in the xy-plane inside the curve $C_1$, $\Omega^T$ is the transition region in the xy-plane between the two curves $C_0$ and $C_1$, r is the radial offset distance from the xy-coordinate to the curve $C_1$, and where $$h(r) = ((R-r)/R)^2(-2((R-r)/R))$$

e. generating output data defining the composite surface in accordance with the formula;

$$g_i(x,y) = (1 = \Phi(x,y))f_0(x,y) + \Phi(x,y)f_1(x,y)$$

f. machining the workpiece in accordance with said output data.

10. The method as defined in claim 9 in which the workpiece is used to manufacture an automotive inner panel.

* * * * *